(12) United States Patent
Ramaswamy et al.

(10) Patent No.: US 10,090,462 B2
(45) Date of Patent: Oct. 2, 2018

(54) RESISTIVE MEMORY DEVICES

(71) Applicant: Micron Technology, Inc., Boise, ID (US)

(72) Inventors: Durai Vishak Nirmal Ramaswamy, Boise, ID (US); Lei Bi, Boise, ID (US); Beth R. Cook, Meridian, ID (US); Dale W. Collins, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 242 days.

(21) Appl. No.: 14/960,953

(22) Filed: Dec. 7, 2015

(65) Prior Publication Data
US 2016/0086664 A1 Mar. 24, 2016

Related U.S. Application Data

(62) Division of application No. 13/599,865, filed on Aug. 30, 2012, now Pat. No. 9,224,945.

(51) Int. Cl.
H01L 45/00 (2006.01)
H01L 27/24 (2006.01)
(Continued)

(52) U.S. Cl.
CPC ...... H01L 45/1233 (2013.01); G11C 13/0007 (2013.01); G11C 13/0069 (2013.01);
(Continued)

(58) Field of Classification Search
CPC ............. H01L 21/8239; H01L 27/105; H01L 45/00–45/08; H01L 49/00;
(Continued)

(56) References Cited

U.S. PATENT DOCUMENTS 6,972,985 B2 12/2005 Rinerson et al.
7,947,117 B2 7/2011 Tan et al.
(Continued)

FOREIGN PATENT DOCUMENTS

CN 101548403 A 9/2009
CN 102413858 A 4/2012
(Continued)

OTHER PUBLICATIONS

"Chinese Application Serial No. 201380050346.6, Response filed Aug. 22, 2016 to Office Action dated Apr. 12, 2016", with English translation of claims, 11 pgs.
(Continued)

Primary Examiner — Eduardo A Rodela
(74) Attorney, Agent, or Firm — Schwegman Lundberg & Woessner, P.A.

(57) ABSTRACT

Electronic apparatus, systems, and methods can include a resistive memory cell having a structured as an operably variable resistance region between two electrodes and a metallic barrier disposed in a region between the dielectric and one of the two electrodes. The metallic barrier can have a structure and a material composition to provide oxygen diffusivity above a first threshold during program or erase operations of the resistive memory cell and oxygen diffusivity below a second threshold during a retention state of the resistive memory cell. Additional apparatus, systems, and methods are disclosed.

15 Claims, 8 Drawing Sheets

(51) Int. Cl.
*H01L 21/02* (2006.01)
*G11C 13/00* (2006.01)

(52) U.S. Cl.
CPC .... *G11C 13/0097* (2013.01); *H01L 21/02414* (2013.01); *H01L 21/02483* (2013.01); *H01L 27/2427* (2013.01); *H01L 27/2481* (2013.01); *H01L 45/04* (2013.01); *H01L 45/08* (2013.01); *H01L 45/12* (2013.01); *H01L 45/1246* (2013.01); *H01L 45/1253* (2013.01); *H01L 45/145* (2013.01); *H01L 45/146* (2013.01); *H01L 45/147* (2013.01); *H01L 45/1616* (2013.01); *G11C 2213/12* (2013.01); *G11C 2213/51* (2013.01); *G11C 2213/55* (2013.01); *H01L 27/24* (2013.01)

(58) Field of Classification Search
CPC ... H01L 45/1253; H01L 27/101; H01L 45/10; H01L 45/12; H01L 45/122; H01L 45/1206; H01L 45/1233; H01L 45/14; H01L 45/141; H01L 45/144; H01L 45/145; H01L 27/0688; H01L 27/0711; H01L 27/11514; H01L 27/11521; H01L 27/11551; H01L 27/11578; H01L 27/11597; H01L 27/2427; H01L 27/2463; H01L 27/2472; H01L 27/249; G11C 13/0009; G11C 17/16
See application file for complete search history.

(56) References Cited

U.S. PATENT DOCUMENTS

| | | | |
|---|---|---|---|
| 8,031,510 B2 | 10/2011 | Schloss et al. | |
| 8,067,762 B2 | 11/2011 | Ho et al. | |
| 8,173,989 B2 | 5/2012 | Lee et al. | |
| 8,817,522 B2 | 8/2014 | Ramaswamy et al. | |
| 2003/0129771 A1* | 7/2003 | Summerfelt | H01L 28/75 438/3 |
| 2008/0001172 A1 | 1/2008 | Karg et al. | |
| 2008/0090337 A1 | 4/2008 | Williams | |
| 2009/0027955 A1* | 1/2009 | Koh | G11C 13/0007 365/163 |
| 2009/0034320 A1 | 2/2009 | Ueda | |
| 2009/0072212 A1* | 3/2009 | Van Der Sluis | G11C 17/16 257/2 |
| 2009/0095985 A1 | 4/2009 | Lee et al. | |
| 2009/0121823 A1 | 5/2009 | Kawano et al. | |
| 2009/0219740 A1 | 9/2009 | Nagashima et al. | |
| 2009/0302315 A1 | 12/2009 | Lee et al. | |
| 2010/0019219 A1 | 1/2010 | Lee | |
| 2010/0072449 A1 | 3/2010 | Hsieh et al. | |
| 2010/0095057 A1 | 4/2010 | Li et al. | |
| 2010/0155686 A1 | 6/2010 | Bratkovski et al. | |
| 2010/0277967 A1 | 11/2010 | Lee et al. | |
| 2011/0006275 A1* | 1/2011 | Roelofs | G11C 13/0007 257/2 |
| 2011/0044089 A1 | 2/2011 | Goux et al. | |
| 2011/0140067 A1 | 6/2011 | Chen et al. | |
| 2011/0149636 A1 | 6/2011 | Schloss et al. | |
| 2011/0233504 A1 | 9/2011 | Liu et al. | |
| 2011/0242875 A1 | 10/2011 | Nagashima et al. | |
| 2011/0297927 A1 | 12/2011 | Ramaswamy et al. | |
| 2011/0310656 A1 | 12/2011 | Kreupl et al. | |
| 2012/0008369 A1 | 1/2012 | Shimuta et al. | |
| 2012/0056326 A1* | 3/2012 | Kraus | C23C 16/34 257/751 |
| 2012/0088328 A1 | 4/2012 | Phatak et al. | |
| 2012/0091420 A1* | 4/2012 | Kusai | G11C 11/5685 257/4 |
| 2012/0241707 A1* | 9/2012 | Takahashi | G11C 13/0007 257/2 |
| 2012/0292584 A1 | 11/2012 | Rocklein et al. | |
| 2012/0314468 A1 | 12/2012 | Siau et al. | |
| 2013/0043452 A1* | 2/2013 | Meyer | H01L 27/101 257/4 |
| 2013/0043455 A1 | 2/2013 | Bateman | |
| 2013/0069030 A1* | 3/2013 | Wells | H01L 45/085 257/4 |
| 2013/0214237 A1* | 8/2013 | Tendulkar | H01L 45/08 257/4 |
| 2014/0043911 A1 | 2/2014 | Samachisa et al. | |
| 2014/0056053 A1 | 2/2014 | Ramaswamy et al. | |
| 2014/0061568 A1 | 3/2014 | Ramaswamy et al. | |

FOREIGN PATENT DOCUMENTS

| | | |
|---|---|---|
| CN | 102484127 A | 5/2012 |
| CN | 104662610 A | 5/2015 |
| JP | 2010050124 A | 3/2010 |
| JP | 2010251352 A | 11/2010 |
| KR | 1020090126530 A | 12/2009 |
| KR | 1020120046327 A | 5/2012 |
| TW | 200951956 A | 12/2009 |
| TW | 201007762 A | 2/2010 |
| TW | 201209825 A | 3/2012 |
| TW | 201209827 A | 3/2012 |
| WO | WO-2012044276 A1 | 4/2012 |
| WO | WO-2012102734 A1 | 8/2012 |
| WO | WO-2014031617 A1 | 2/2014 |
| WO | WO-2014036264 A1 | 3/2014 |

OTHER PUBLICATIONS

"Japanese Application Serial No. 2015-530042, Office Action dated May 2, 2017", With English Translation, 6 pgs.
"Taiwanese Application Serial No. 102131421, Office Action dated Jan. 18, 2017", (w/ English Translation), 11 pgs.
"Taiwanese Application Serial No. 102131421, Response filed Mar. 28, 2017 to Office Action dated Jan. 18, 2017", W/English Claims, 29 pgs.
"Chinese Application Serial No. 201380050346.6, Office Action dated Apr. 12, 2016", W/ English Translation, 9 pgs.
"Chinese Application Serial No. 201380050346.6, Preliminary Amendment filed Nov. 2, 2015", W/ English Claims, 15 pgs.
"European Application Serial No. 13832146.8, Communication pursuant to Rules 161(1) and 162 EPC dated Apr. 10, 2015", 4 pgs.
"European Application Serial No. 13832416.8, Extended European Search Report dated Mar. 18, 2016", 6 pgs.
"European Application Serial No. 13832146.8, Response filed Oct. 19, 2015 to Communication pursuant to Rules 161(1) and 162 EPC dated Apr. 10, 2015", 11 pgs.
"International Application Serial No. PCT/US2013/057297, International Preliminary Report on Patentability dated Mar. 12, 2015", 6 pgs.
"International Application Serial No. PCT/US2013/057297, International Search Report dated Dec. 26, 2013", 3 pgs.
"International Application Serial No. PCT/US2013/057297, Written Opinion dated Dec. 26, 2013", 4 pgs.
Kim, Sungho, et al., "Resistive Switching Characteristics of Sol-Gel Zinc Oxide Films for Flexible Memory Application", IEEE Transactions on Electron Devices, vol. 56, No. 4, (Apr. 2009), 696-699.

* cited by examiner

RESISTIVE MEMORY DEVICES

PRIORITY APPLICATION

This application is a divisional of U.S. application Ser. No. 13/599,865, filed Aug. 30, 2012, which is incorporated herein by reference in its entirety.

BACKGROUND

The semiconductor device industry has a market driven need to improve operation of memory devices. Improvements to memory devices can be addressed by advances in memory device design. Enhancements in memory devices can also be realized by advances in processing.

DETAILED DESCRIPTION

Figure 1:
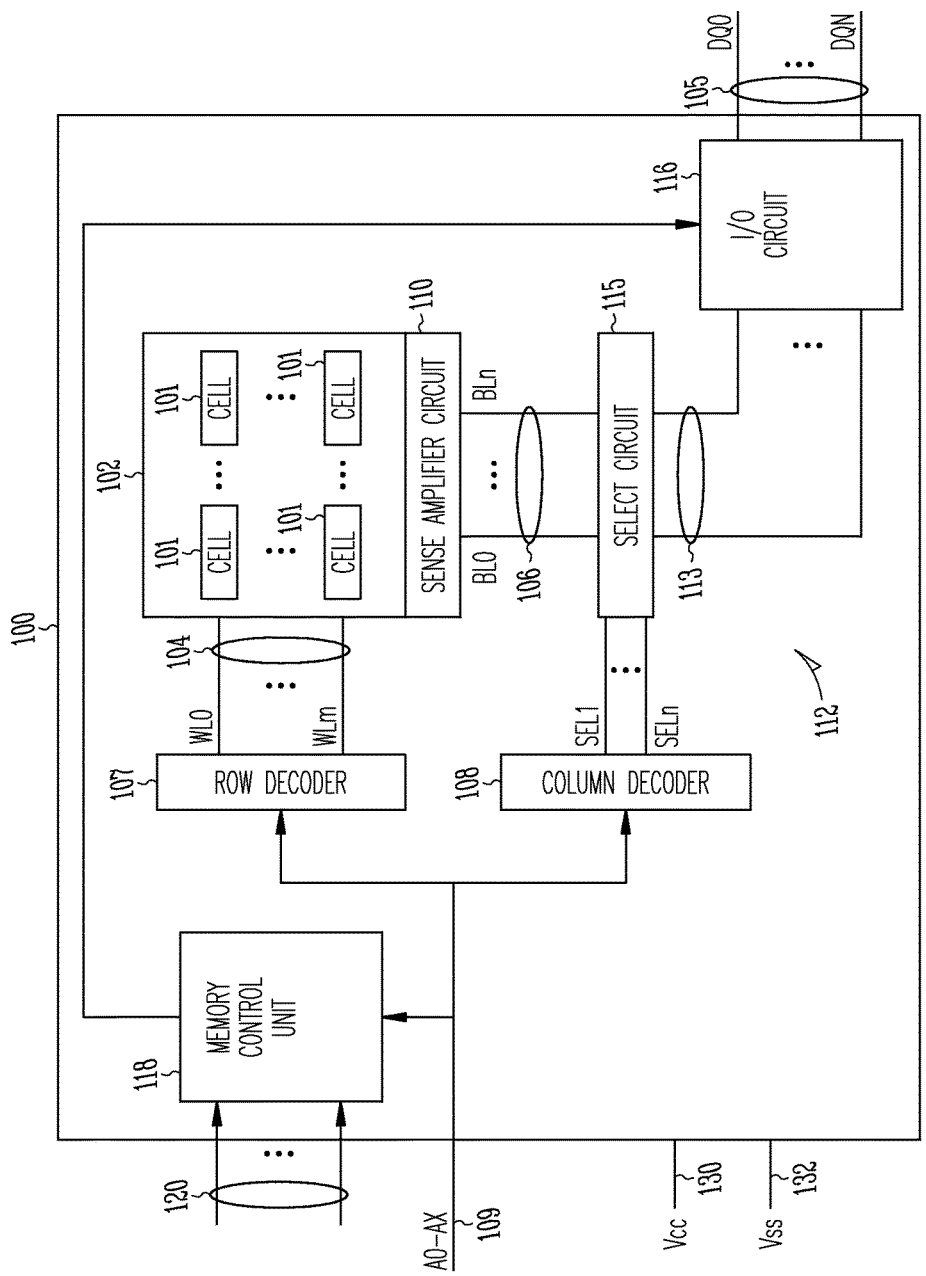
FIG. 1 shows a block diagram of an example memory device, in accordance with various embodiments.

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Different memory cell architectures provide a variety of different memory devices. For example, a resistive memory device uses an architecture in which resistance states of a material region of the memory cell are used to correspond to stored data. The resistance states can correspond to a low resistance state (LRS) and a high resistance state (HRS). Using more than two resistance regions, other states are possible. A resistive memory device can be structured as a resistive random access memory (RRAM).

In addition, there are different formats in which a resistive memory device may be realized. One format is as a filamentary resistive memory device. In a filamentary resistive memory cell, the memory device is structured to operatively create a filament that alters the resistance of a memory cell. Another format of a resistive memory cell is an areal resistive memory cell. An areal resistive memory cell operates as an area dependent structure rather than a filamentary based structure. Compared to filamentary resistive memory cells, areal resistive memory cells can show superior scalability and built-in non-linearity of cell current-voltage characteristics. Such properties may enable the construction of devices for use in sub-20 nm nonvolatile memory applications.

One kind of areal resistive memory cell is a multi-valence oxide (MVO) cell. With an electric field applied to a MVO cell, movement of oxygen can occur such that the MVO can receive or provide oxygen ions, changing valence states. An MVO cell can include a conducting metal oxide (CMO) region connected to an insulating metal oxide (IMO) region with the combined CMO region and IMO region connected to and between two electrodes, where the IMO region provides a changeable resistance under an applied electric field. Using a CMO and IMO layered device, oxygen ions can be moved into and out of the IMO material, changing its energy barrier height, which can change the resistivity (conductivity) of the layered device. MVO devices can operate in a bipolar manner in which an electric field of one polarity moves oxygen in one direction for a set operation and the reverse polarity moves oxygen in the other direction to provide a reset capability.

However, a challenge to providing reliable memory operations using conventional MVO technology includes poor data retention due to oxygen diffusion/drift after the MVO cell is placed in a HRS or a LRS. In addition, the tunneling resistance of conventional MVO cells may be too high for fast sensing due to the high effective work function of a noble metal, used as an electrode, and the conductive metal oxide materials to which it is connected.

In various embodiments, a resistive memory cell structure includes a region inserted between an oxide and a dielectric, the combined structures arranged between two electrodes. Such a structure can be used to enhance retention characteristics compared to conventional MVO cells and increase operational current density. The inserted region can serve as a diffusion barrier for oxygen. The inserted region may be structured as a relatively thin region between an oxide and a dielectric. The oxide may be a conducting oxide, such as a conducting metal oxide, and the dielectric may be an insulating oxide. For example, to increase cell read current, the material and thickness for the region inserted layer between an oxide and a dielectric can be selected. The barrier can include a metallic material through which oxygen can be operatively conducted. A metallic material is a metal, metal alloy, combination of metals, a composition including a metal and a non-metal such that the composition has metallic conductivity (resistivity) properties, or combinations of such compositions. The material and structure of the barrier can be selected, according to a given criteria, to have one or more characteristics such as having good oxygen diffusivity during program/erase operations while exhibiting low oxygen diffusivity during retention, maintaining metallic or semiconducting conducting properties during cell operation and oxygen movement to allow low cell resistance, and exhibiting a low effective work function when contacting with the dielectric of the resistive memory cell.

FIG. 1 shows a block diagram of an example embodiment of a memory device 100. Memory device 100 can include a memory array 102 having a plurality of memory cells 101. A memory array is a systematic arrangement of memory cells that can be logically arranged according to a plurality of parameters. In various embodiments, each memory cell can be addressed according to values of two parameters. The two parameters may be referred to as a row and a column. A memory cell may be logically located in the memory array indexed uniquely according to a value for a row and a value for a column. Rows and columns are not limited to a particular physical orientation or linear relationship. A row of a memory array may be arranged as a group of memory cells that can be accessed at the same time by a decoder assigned to row values. A column of a memory array may be arranged as a group of memory cells that can be accessed at the same time by a decoder assigned to column values. Memory cells 101 can be arranged in rows and columns along with access lines 104 and first data lines 106. For example, access lines can be structured as wordlines to conduct signals WL0 through WLm and first data lines can be structured as bit lines to conduct signals BL0 through BLn. Memory device 100 can use access lines 104 and first data lines 106 to transfer information to and from memory cells 101. A row decoder 107 and a column decoder 108 decode address signals A0 through AX on address lines 109 to determine which ones of memory cells 101 are to be accessed.

A sense amplifier circuit 110 operates to determine the value of information read from memory cells 101 and the information read is communicated in the form of signals to first data lines 106. Sense amplifier circuit 110 can also use the signals on first data lines 106 to determine values of information to be written to memory cells 101.

Memory device 100 can include circuitry 112 to transfer information between memory array 102 and input/output (I/O) lines 105. Signals DQ0 through DQN on the I/O lines 105 can represent information read from or written into memory cells 101. I/O lines 105 can include nodes within memory device 100 (or alternatively, pins, solder balls, or other interconnect technologies such as controlled collapse chip connection (C4), or flip chip attach (FCA)) on a package where the memory device 100 can reside. Other devices external to memory device 100 can communicate with memory device 100 through I/O lines 105, address lines 109, or control lines 120. For example, such external devices can include a memory controller or a processor.

Memory device 100 can perform memory operations, such as a read operation, to read information from selected ones of memory cells 101 and a programming operation (also referred to as a write operation) to program (e.g., to write) information into selected ones of memory cells 101. Memory device 100 can also perform a memory erase operation to clear information from some or all of memory cells 101. A memory control unit 118 controls memory operations based on signals on control lines 120. Examples of the signals on the control lines 120 can include one or more clock signals and other signals to indicate which operation (e.g., a programming or read operation) memory device 100 can or should perform. Other devices external to memory device 100 can control the values of the control signals on the control lines 120. The external devices can include, for example, a processor or a memory controller. Specific values of a combination of the signals on control lines 120 can produce a command, such as a programming or read command for example, that can cause memory device 100 to perform a corresponding memory operation. The corresponding memory operation can include, for example, a program, read, or erase operation.

Each of memory cells 101 can be programmed to store information representing a value of a single bit or a value of multiple bits such as two, three, four, or a higher number of bits. For example, each of memory cells 101 can be programmed to store information representing a binary value "0" or "1" of a single bit. The single bit per cell is sometimes called a single level cell. In another example, each of memory cells 101 can be programmed to store information representing a value representing multiple bits, such as one of four possible values "00," "01," "10," and "11" of two bits, one of eight possible values "000," "001," "010," "011," "100," "101," "110," and "111" of three bits, or one of another set of values of multiple bits. A cell that has an ability to store multiple bits is sometimes referred to as a multi-level cell or multi-state cell.

Memory device 100 can receive a supply voltage, including supply voltage signals Vcc and Vss, on a first supply line 130 and a second supply line 132, respectively. Supply voltage signal Vss can operate at a ground potential. The ground potential can have a value of approximately zero volts. Supply voltage signal Vcc can include an external voltage supplied to memory device 100 from an external power source such as a battery or an alternating current to direct current (AC-DC) converter circuitry.

Circuitry 112 of memory device 100 can include a select circuit 115 and an input/output (I/O) circuit 116. Select circuit 115 can respond to signals SEL1 through SELn to select signals on first data lines 106 and second data lines 113 that can represent the information read from or programmed into memory cells 101. Column decoder 108 can selectively activate the SEL1 through SELn signals based on the A0 through AX address signals on address lines 109. Select circuit 115 can select the signals on first data lines 106 and second data lines 113 to provide communication between memory array 102 and I/O circuit 116 during read and programming operations.

Memory device 100 can include a non-volatile memory device and memory cells 101 can include non-volatile memory cells such that memory cells 101 can retain information stored therein when power is disconnected from memory device 100. The power may be represented by the labels Vcc, Vss, or both.

Each of memory cells 101 can include a memory element having material, at least a portion of which can be programmed to change the resistance value of the material. Each of memory cells 101 can have a state corresponding to a resistance value when each of memory cells 101 is programmed in a programming operation. Different resistance values can thus represent different values of information programmed in each of memory cells 101.

Memory device 100 can perform a programming operation when it receives a programming command and a value of information to be programmed into one or more selected ones of memory cells 101. The programming command can be received from an external processor, a memory controller, or other controller. Based on the value of the information, memory device 100 can program the selected memory cells to cause them to have appropriate resistance values to represent the values of the information stored therein. Memory device 100 may include devices and memory cells, and operate using memory operations similar to or identical to those described below with reference to various other figures and embodiments discussed herein.

Figure 2:
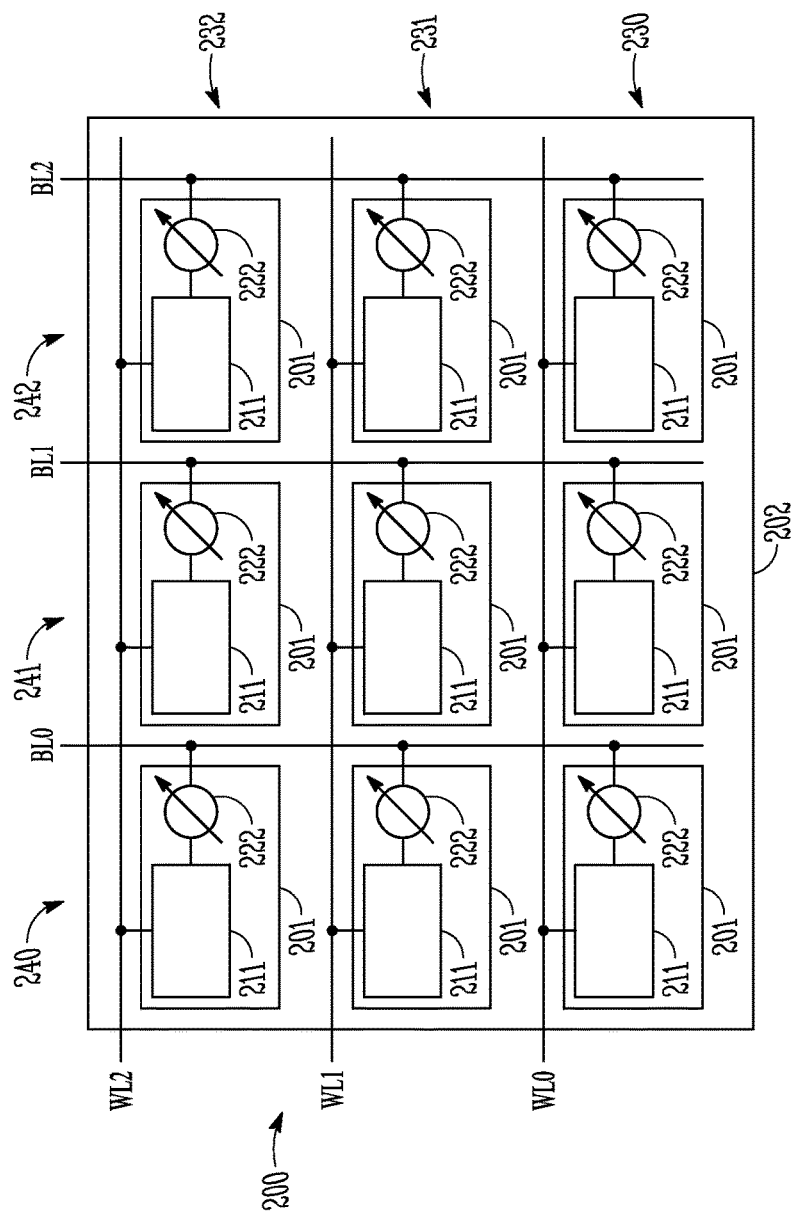
FIG. 2 shows a block diagram of features of an example memory device that includes a memory array having memory cells with access components and memory elements, in accordance with various embodiments.

FIG. 2 shows a block diagram of features of an example embodiment of a memory device 200 that includes a memory array 202 having memory cells 201 with access components 211 and memory elements 222. Memory array 202 may be similar or identical to memory array 102 of FIG. 1. Memory cells 201 can be arranged in a number of rows 230, 231, and 232 along with access lines to conduct signals such as signals WL0, WL1, and WL2. The access lines may be word lines. Memory cells 201 can also be arranged in a number of columns 240, 241, and 242 along with data lines to conduct signals such as signals BL0, BL1, and BL2. The data lines may be bit lines. Access components 211 can turn on, for example by using appropriate values of signals WL0, WL1, and WL2, to allow access to memory elements 222 to read information from or program information into the memory elements 222. Memory array 202 may have more or less than the number of memory cells 201 shown in FIG. 2.

Programming information into memory elements 222 can include causing memory elements 222 to have specific resistance values or specified ranges of resistance values. For a resistive random access memory cell, an electric field can be applied to move oxygen vacancies. Then, reading information from a memory element 222 can include measuring a resistance value of memory element 222. Measuring the resistance can include sensing a value of a current flowing through various ones of memory cells 201. Based on a measured value of the current, a corresponding value of the information stored in the memory can be determined. A determination of the information can be based on the value of the current.

Figure 3:
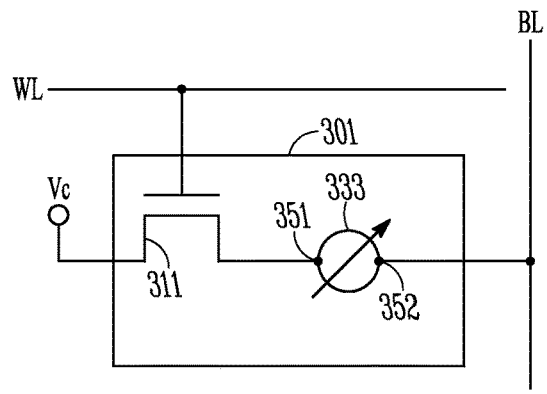
FIG. 3 shows a schematic diagram of an example memory cell having an access component coupled to a memory element, in accordance with various embodiments.
Figure 4:
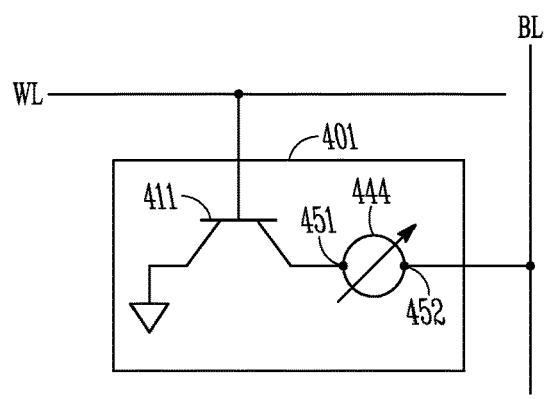
FIG. 4 shows a schematic diagram of an example memory cell having an access component coupled to a memory element, in accordance with various embodiments.
Figure 5:
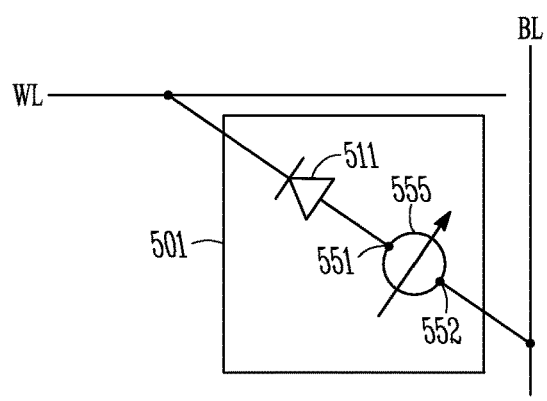
FIG. 5 shows a schematic diagram of an example memory cell having an access component coupled to a memory element, in accordance with various embodiments.

FIGS. 3 through 5 each show a schematic diagram of example embodiments of different memory cells 301, 401, 501 having different access components 311, 411, 511 coupled to memory elements 333, 444, 555, respectively. Lines labeled WL and BL in FIGS. 3 through 5 can correspond to any one of the access lines 104 and any one of the first data lines 106 of FIG. 1, respectively. FIGS. 3 through 5 show examples of access components 311, 411, 511 including a metal-oxide-semiconductor field-effect transistor (MOSFET), a bipolar junction transistor (BJT), and a diode, respectively. Memory cells 301, 401, and 501 can include other types of access components.

Each of the memory elements 333, 444, 555 can be coupled to and disposed between two electrodes, such as a first electrode 351 and a second electrode 352 of FIG. 3, a first electrode 451 and a second electrode 452 of FIG. 4, or a first electrode 551 and a second electrode 552 of FIG. 5. FIGS. 3 through 5 schematically show each of these electrodes as dots. Structurally, each of these electrodes can include a conductive material. Respective ones of the memory elements 333, 444, 555 can include a material that can be changed, for example, in response to a signal, to have different resistance values. The value of information stored in the memory element can correspond to the resistance value or range of the memory element. The access components 311, 411, and 511 can enable signals to be transferred to and from the memory elements 333, 444, 555 via the respective pairs of electrodes during operation of the memory cells such as read, program, or erase operations.

For memory cells 301, 401, or 501 realized as a resistive random access memory (RRAM) cell, electrodes 351 and 352, electrodes 451 and 452, electrodes 551 and 552 can be two electrodes of the RRAM cell with an operably variable resistance region between the two electrodes. Memory elements 333, 444, and 555 can be realized as the operably variable resistance region. A dielectric can be structured as the operably variable resistance region between the two electrodes. The dielectric includes material operable to receive and provide oxygen, providing a change of resistance according to whether oxygen is being collected or removed from the dielectric. The dielectric can be an oxide. The oxide can include one or more of zirconium oxide, hafnium oxide, titanium oxide, zirconium silicon oxide, or aluminum oxide. Other oxides or metal oxides may be used. Memory cells 301, 401, or 501 structured as a resistive random access memory cells can include a buffer region between the respective oxide 333, 444, or 555 and one of the two corresponding electrodes 351 and 352, 451 and 452, or 551 and 552, respectively. In various embodiments, at least one of the two corresponding electrodes 351 and 352, 451 and 452, or 551 and 552, can include a material that is reactive with the oxide.

A programming operation may use signal WL to turn on the access components 311, 411, 511, and then apply a signal, for example a signal having a programming voltage or current, through the memory elements 333, 444, 555. Such a signal can cause at least a portion of the material of the memory elements 333, 444, 555 to change state. The change can be reversed by, for instance, performing an erase operation. The differences in resistance values can be used to represent different states that represent different values of the information that is stored in the memory elements 333, 444, 555.

A read operation may use the signal WL to turn on access components 311, 411, or 511, and then apply a signal having a voltage or a current through the memory elements 333, 444, 555. The read operation may measure the resistance of the memory cells 301, 401, 501, based on a read voltage or current, to determine the corresponding value of information stored therein. For example, in each of memory cells 301, 401, 501, a different resistance value can impart a different value (e.g., voltage or current value) to signal BL when a read current passes through the memory elements 333, 444, 555. Other circuitry of the memory device, for example a circuit such as I/O circuit 116 of FIG. 1, can use the signal BL to measure the resistance value of memory elements 333, 444, 555 to determine the value of the information stored therein.

In a read operation, the value (e.g., the voltage) of the signal (e.g., the signal BL in FIG. 3 or FIG. 4 or the signal WL in FIG. 5) that creates a current flowing through the memory element can be sufficient to create the current but insufficient to cause any portion of the memory element to change state. Consequently, the value of the information stored in the memory element can remain unchanged during and after the read operation.

In an erase operation, the voltage value of the signal (e.g., the signal BL in FIG. 3 or FIG. 4 or the signal WL in FIG. 5) can have an opposite polarity from the voltage used in a programming operation. The signal, creating a current in this case, can therefore change, or reset, the material of the memory element to its original state; for example, a state prior to any programming being performed on the memory cells.

Figure 6:
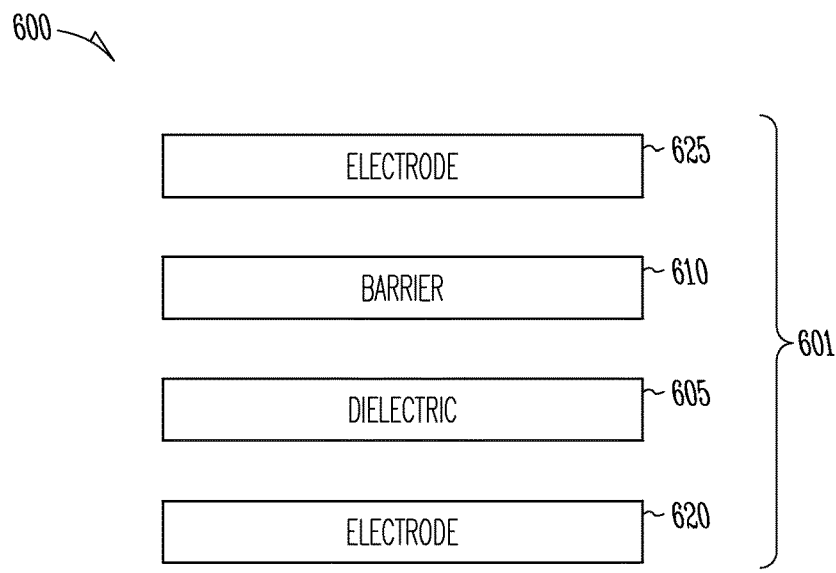
FIG. 6 shows a block diagram of an example apparatus having components arranged as a resistive memory cell, in accordance with various embodiments.

FIG. 6 shows a block diagram of an example embodiment of an apparatus 600 having components arranged as a resistive memory cell 601. Resistive memory cell 601 includes two electrodes 620 and 625; a dielectric 605 structured as an operably variable resistance region between electrodes 620 and 625; and a barrier 610 disposed in a region between dielectric 605 and one of the two electrodes 620, 625. Resistive memory cell 601 can be structured having an area dependent variable resistance rather than a filamentary based variable resistance. Barrier 610 has a structure and a material composition providing oxygen diffusivity above a first threshold during program or erase of resistive memory cell 601 and oxygen diffusivity below a second threshold during a retention state of resistive memory cell 601, where the first threshold is greater than the second threshold. The first and second thresholds can be set to provide a range of oxygen diffusivities as a basis for selection of material and structure of barrier 610. Barrier 610 can have good oxygen diffusivity during program/erase, while showing low oxygen diffusivity during retention. The program/erase can be at a high electric field and the retention can be at a low electric field. The structure and material composition of barrier 610 can be selected to maintain a metallic state or a semiconducting state during cell operation to provide oxygen movement to allow a low resistance to resistive memory cell 601.

Barrier 610 can include metallic material. Examples of such metallic material include, but are not limited to, one or more of ruthenium, ruthenium oxide, indium oxide, or zinc oxide. The ruthenium oxide, indium oxide, and zinc oxide can be in the form of, but not limited to, $RuO_2$, $In_2O_3$, and ZnO, respectively. Dielectric 605 can include, but is not limited to, one or more of hafnium oxide ($HfO_x$), zirconium oxide ($ZrO_x$), zirconium silicon oxide ($ZrSiO_x$), zirconium silicon oxynitride (ZrSiON), hafnium silicon oxide ($HfSiO_x$), hafnium silicon oxynitride (HfSiON), aluminum oxide ($AlO_x$), aluminum silicon oxide ($AlSiO_x$), aluminum silicon oxynitride (AlSiON), or combinations of these materials. In various embodiments, one or both of the two electrodes 620 and 625 can include one or more noble metals. Other conductive materials can be used for electrodes 620 and 625. Electrodes 620 and 625 can be composed of the same material or different materials. Electrodes 620 and 625 can have the same structure or different structures.

Figure 7:
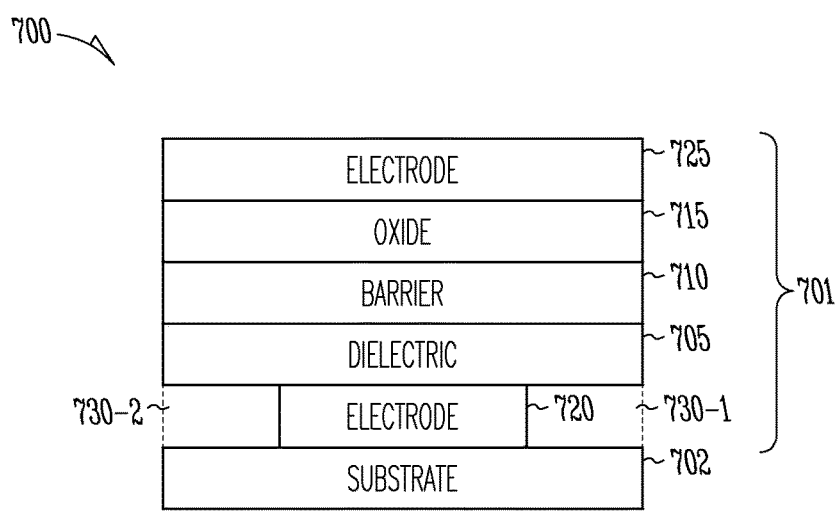
FIG. 7 shows a block diagram of an example apparatus having components arranged as a resistive memory cell, in accordance with various embodiments.

FIG. 7 shows a block diagram of an example embodiment of an apparatus 700 having components arranged as a resistive memory cell 701. Resistive memory cell 701 can include a first electrode 720 and a second electrode 725; a dielectric 705 on first electrode 702, dielectric 705 structured as an operably variable resistance region; a barrier 710 disposed on dielectric 705; and an oxide 715 disposed on barrier 710 and adjacent second electrode 725. Barrier 710 can include metallic material through which oxygen can move. Barrier 710 can have a structure and a material composition providing oxygen diffusivity above a first threshold during program or erase of resistive memory cell 701 and oxygen diffusivity below a second threshold during a retention state of resistive memory cell 701, where the first threshold is greater than the second threshold. The first and second thresholds can be set to provide a range of oxygen diffusivities as a basis for selection of material and structure of barrier 710. Barrier 710 can have good oxygen diffusivity during program/erase, while showing low oxygen diffusivity during retention. The program/erase can be at a high electric field and the retention can be at a low electric field. The structure and material composition of barrier 710 can be selected to maintain a metallic state or a semiconducting state during cell operation to provide oxygen movement to allow a low resistance to resistive memory cell 701. The structure and material composition of barrier 710 can be selected to maintain a metallic state or a semiconducting state during cell operation to provide oxygen movement to allow a low resistance to the resistive memory cell 701.

Barrier 710 can include metallic material. Examples of the metallic material include, but are not limited to, one or more of ruthenium, ruthenium oxide, indium oxide, or zinc oxide. The ruthenium oxide, indium oxide, and zinc oxide can be in the form of, but not limited to, $RuO_2$, $In_2O_3$, and ZnO, respectively.

Dielectric 705 can include a dielectric material, which in operation of resistive memory cell 701 allows movement of oxygen in and out of the dielectric material, providing a resistance change to resistive memory cell 701. Example of such dielectric materials include, but are not limited to, one or more of $HfO_x$, $ZrO_x$, $ZrSiO_x$, ZrSiON, $HfSiO_x$, HfSiON, $AlO_x$, $AlSiO_x$, AlSiON, or combinations of these materials. Oxide 715 includes oxide material providing an oxygen source such that oxygen can be moved from oxide 715 through barrier 710 to dielectric 705 and oxygen can be collected in oxide 715 from movement through barrier 710 from dielectric 705. Examples of such oxides can include, but are not limited to, one or more of praseodymium calcium manganese oxide (PCMO), lanthanum strontium cobalt oxide, or lanthanum strontium manganese oxide. The PCMO, lanthanum strontium cobalt oxide, and lanthanum strontium manganese oxide can be in the form of, but not limited to, $(PrCa)MnO_3$, $(LaSr)CoO_3$, and $(LaSr)MnO_3$, respectively.

One or both of the two electrodes 720 and 725 can include one or more of platinum, gold, or iridium. Other noble metals or combinations thereof can be used in one or both of the two electrodes 720 and 725. Other conductive materials can be used for electrodes 720 and 725. Electrodes 720 and 725 can be composed of the same material or different materials. Electrodes 720 and 725 can have the same structure or different structures. Electrode 720 can be disposed within or between insulative regions 730-1 and 730-2. Insulative regions 730-1 and 730-2 can be realized, for example, as silicon nitride regions. In another embodiment, electrode 720 may extend across the substrate without SiN surrounding it.

Resistive memory cell 701 is disposed on a substrate 702. Substrate 702 may comprise silicon, silicon germanium, germanium, gallium arsenide, silicon-on-sapphire, or other suitable materials. Substrate 702 can include other structures operable with resistive memory cell 701. Various of these other structures can be formed on or within substrate 702. Resistive memory cell 701 can be arranged in an array of resistive memory cells of a memory. The resistive memory cells can be arranged as areal resistive memory cells.

Figure 8:
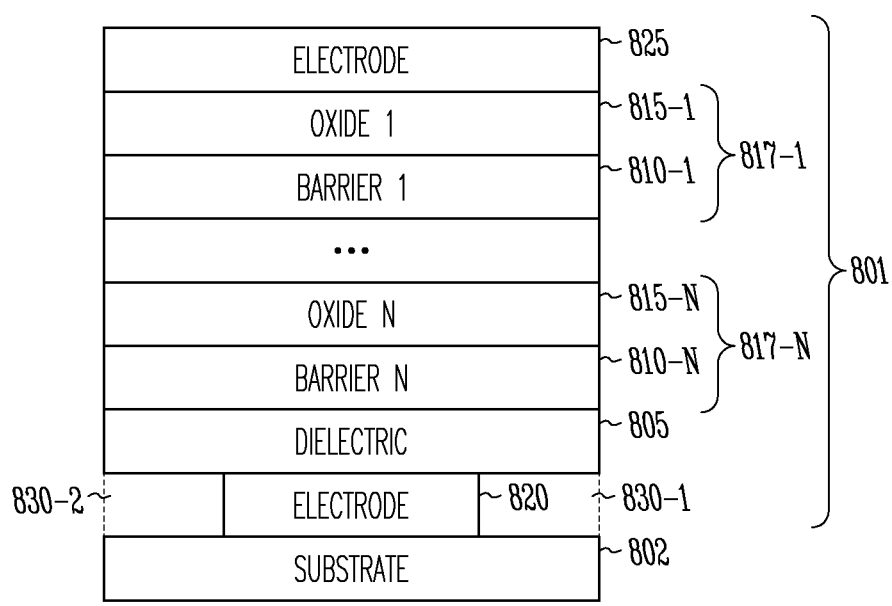
FIG. 8 shows a block diagram of an example apparatus having components arranged as a resistive memory cell, in accordance with various embodiments.

FIG. 8 shows a block diagram of an example embodiment of an apparatus 800 having components arranged as a resistive memory cell 801. Resistive memory cell 801 includes a first electrode 820 and a second electrode 825; a dielectric 805 on first electrode 820, dielectric 805 structured as an operably variable resistance region; structural pairs 817-1 . . . 817-N of oxide on barrier, where structural pairs 817-1 . . . 817-N are stacked on each other between dielectric 805 and second electrode 825. Structural pairs 817-1 . . . 817-N include oxide 815-1 on barrier 810-1 . . . oxide 815-N on barrier 810-N, respectively. Each of barriers 810-1 . . . 810-N can be low resistance materials, for example metallic materials, through which oxygen can move. Each of barriers 810-1 . . . 810-N can have a structure and a material composition providing oxygen diffusivity above a first threshold during program or erase of resistive memory cell 801 and oxygen diffusivity below a second threshold during a retention state of resistive memory cell 801, where the first threshold is greater than the second threshold. The first and second thresholds can be set to provide a range of oxygen diffusivities as a basis for selection of material and structure of barriers 810-1 . . . 810-N. The structure and material composition of barriers 810-1 . . . 810-N can be selected to maintain a low resistance state (LRS) or a high resistance state (HRS) during cell operation to provide oxygen movement to allow a low resistance to the resistive memory cell 801.

Barriers 810-1 . . . 810-N can include, but are not limited to, one or more of ruthenium, ruthenium oxide, indium oxide, zinc oxide, or other metallic material through which oxygen can move. The ruthenium oxide, indium oxide, and zinc oxide can be in the form of, but not limited to, $RuO_2$, $In_2O_3$, and ZnO, respectively. Oxides 815-1 . . . 815-N can include one or more of PCMO, lanthanum strontium cobalt oxide, lanthanum strontium manganese oxide, or other oxide providing a source of oxygen in resistive memory cell 801.

In various embodiments, alternative structures can be realized as memory cell 801. Though FIG. 8 shows an integral number of structural pairs 817-1 . . . 817-N connecting electrode 825 and dielectric 805, resistive memory cell 801 can include one or more structural pairs along with an additional oxide 815 or barrier 810. This additional region can be structured such that a barrier region contacts electrode 825. This additional region can be structured such that an oxide region contacts dielectric 805. An additional oxide 815 and additional barrier 810 can be included such that the additional barrier region contacts electrode 825 and the additional oxide region contacts dielectric 805. Such additional regions may be viewed as providing a non-integral number of structural pairs. Other stacking arrangements of source oxides and barrier regions may be realized. The multiple stacks of source oxide and barrier layer in memory cell 801 may be implemented to improve the cell performance.

Dielectric 805 can include a dielectric material, which in operation of resistive memory cell 801 allows movement of oxygen in and out the dielectric material, providing a resistance change to resistive memory cell 801. Examples of such dielectric materials include, but are not limited to, one or more of zirconium oxide, hafnium oxide, zirconium silicon oxide, or aluminum oxide. One or both of the two electrodes 820 and 825 can include one or more platinum, gold, or iridium. Other noble metals or combinations thereof can be used in one or both of the two electrodes 820 and 825. Electrode 820 can be disposed within or between insulative regions 830-1 and 830-2. Insulative regions 830-1 and 830-2 can be realized as silicon nitride regions. In another embodiment, electrode 820 may extend across the substrate without SiN surrounding it.

Resistive memory cell 801 is disposed on a substrate 802. Substrate 802 may comprise silicon, silicon germanium, germanium, gallium arsenide, silicon-on-sapphire, or other suitable materials. Substrate 802 can include other structures operable with resistive memory cell 801. Various of these other structures can be formed within substrate 802. The materials used in memory cell 801 can be similar to or identical to the materials of memory cell 601 of FIG. 6 or memory cell 701 of FIG. 7. Resistive memory cell 801 can be arranged as part of an array of resistive memory cells of a memory. The resistive memory cells can be arranged as areal resistive memory cells. The areal resistive memory cells can be arranged in a memory similar or identical to a memory associated with FIG. 1, 2, or 3. The areal resistive memory cells can be arranged in other memory architectures.

Figure 9:
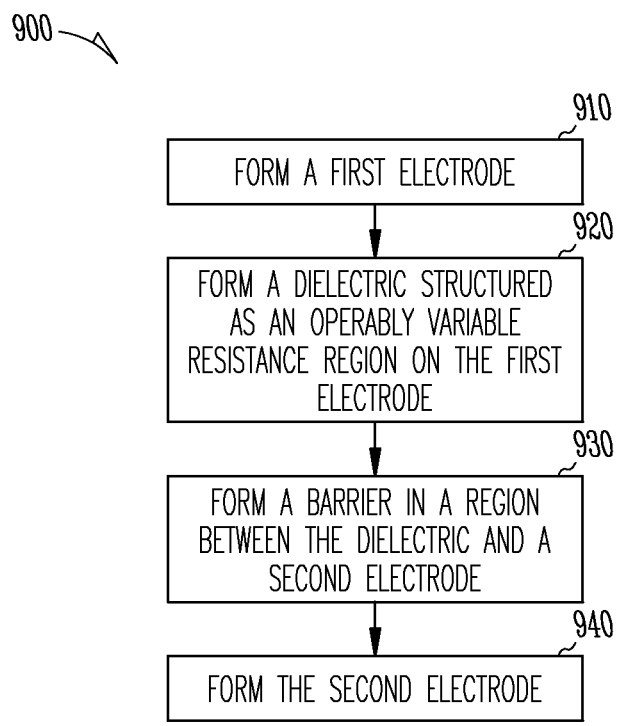
FIG. 9 shows features of an example method of forming an apparatus having a memory cell, in accordance with various embodiments.

FIG. 9 shows features of an example embodiment of a method of forming a structure including forming a resistive memory cell. At 910, a first electrode can be formed. Forming the first electrode can include forming the first electrode in a silicon nitride region. At 920, a dielectric can be formed structured as an operably variable resistance region on the first electrode.

At 930, a barrier can be formed on the dielectric. This can be formed in a region between the dielectric and a second electrode to be formed. The barrier can be a metallic barrier. The barrier can be structured to allow movement of oxygen to and from a source directed to the dielectric under an applied field relative to the source and dielectric and prevent the oxygen from leaving a structure to a level that provides enhanced data retention. The barrier can be formed having a structure and a material composition to provide oxygen diffusivity above a first threshold during program or erase of the resistive memory cell and oxygen diffusivity below a second threshold during a retention state of the resistive memory cell, where the first threshold is greater than the second threshold. The structure and material composition can be selected to maintain a metallic state or a semiconducting state during cell operation to provide oxygen movement to allow a low resistance to the resistive memory cell. Forming the barrier can include forming one or more of Ru, $RuO_2$, $In_2O_3$, ZnO, or metal through which oxygen can operably be moved.

At 940, the second electrode can be formed. Forming the first electrode, forming the second electrode, forming the barrier, or forming the dielectric can include using a monolayer or partial monolayer sequencing process. The monolayer or partial monolayer sequencing process can be conducted as a self-limiting procedure such as atomic layer deposition. Forming the first electrode, forming the second electrode, forming the barrier, or forming the oxide can include using a chemical vapor deposition process. Other fabrication processes typically used in semiconductor device can be used to form resistive memory cells similar to or identical to resistive memory cells as discussed herein, including materials similar to or identical to material as discussed herein.

Figure 10:
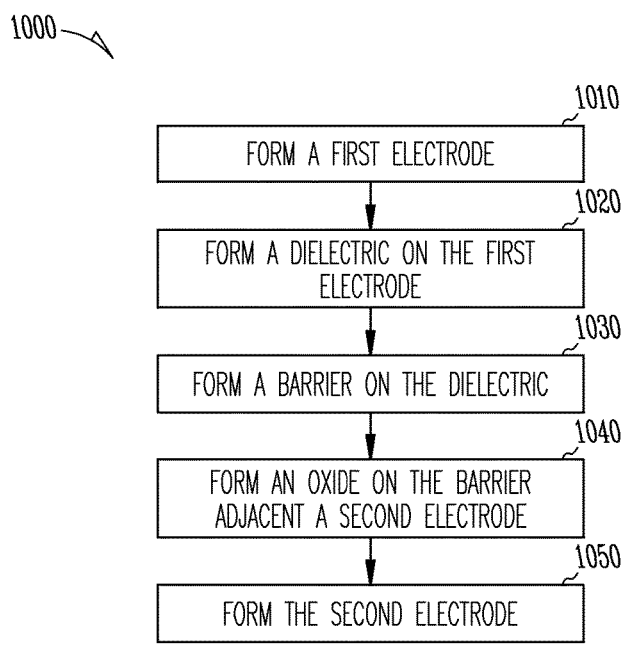
FIG. 10 shows features of an example method of forming a structure including forming a resistive memory cell, in accordance with various embodiments.

FIG. 10 shows features of an example embodiment of a method of forming a structure including forming a resistive memory cell. At 1010, a first electrode is formed. At 1020, a dielectric is formed on the first electrode. The dielectric can be formed of a material and structured as an operably variable resistance region. Forming the dielectric can include forming one or more of zirconium oxide, hafnium oxide, zirconium silicon oxide, or aluminum oxide.

At 1030, a barrier is formed on the dielectric. The barrier can be structured to allow movement of oxygen to and from a source directed to the dielectric under an applied field. The barrier can be selected and formed having a structure and a material composition providing oxygen diffusivity above a first threshold during program or erase of the resistive memory cell and oxygen diffusivity below a second threshold during a retention state of the resistive memory cell. The first threshold can be greater than the second threshold. The structure and material composition of the barrier can be selected to maintain a metallic state or a semiconducting state during cell operation to provide oxygen movement to allow a low resistance to the resistive memory cell. Forming the barrier can include forming one or more of Ru, $RuO_2$, $In_2O_3$, or ZnO.

At 1040, an oxide is formed on the barrier adjacent a second electrode. The oxide can provide a source for oxygen movement to and from the dielectric through the barrier. Forming the oxide can include forming one or more of praseodymium calcium manganese oxide, lanthanum strontium cobalt oxide, or lanthanum strontium manganese oxide. At 1050, the second electrode is formed. Forming one or both of the first electrode and the second electrode can include forming one or more noble metals.

Forming the first electrode, forming the second electrode, forming the dielectric, forming the barrier, or forming the oxide can include using a monolayer or partial monolayer sequencing process. The monolayer or partial monolayer sequencing process can be conducted as a self-limiting procedure such as atomic layer deposition. Forming the first electrode, forming the second electrode, forming the dielectric, forming the barrier, or forming the oxide can include can include using a chemical vapor deposition process. Other fabrication processes typically used in semiconductor device processing can be used to form resistive memory cells similar to or identical to resistive memory cells as discussed herein, including materials similar to or identical to material as discussed herein.

In various embodiments, forming a resistive memory cell can include forming structural pairs, each structural pair including a conducting metal oxide on barrier material. The structural pairs can be stacked on each other between the dielectric and the second electrode.

Figure 11:
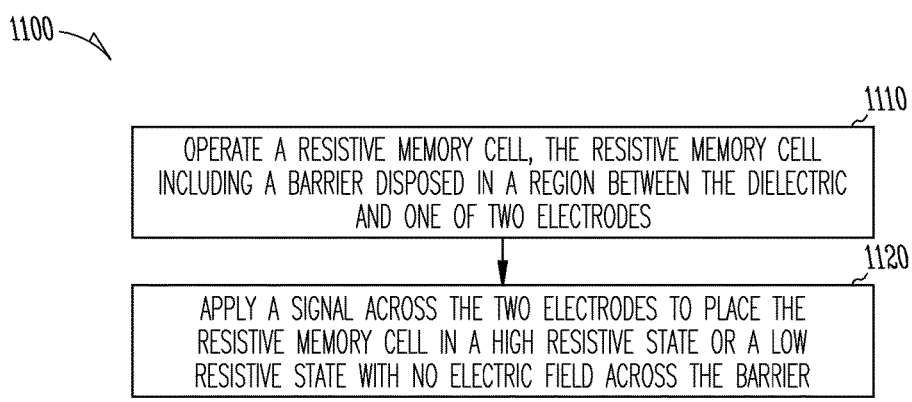
FIG. 11 shows features of an example method of operating a memory cell, in accordance with various embodiments.

FIG. 11 shows features of an example embodiment of a method of operating a memory cell. At 1110, a resistive memory cell is operated. The resistive memory cell can include two electrodes; a dielectric structured as an operably variable resistance region between the two electrodes; and a barrier disposed in a region between the dielectric and one of the two electrodes. The barrier can be a metallic barrier. The barrier can have a structure and a material composition providing oxygen diffusivity above a first threshold during program or erase of the resistive memory cell and oxygen diffusivity below a second threshold during a retention state of the resistive memory cell. The first threshold can be greater than the second threshold. Operating the resistive memory cell can include maintaining metallic or semiconducting status of the barrier during operation of the resistive memory cell. The structure and material composition of the barrier can be formed to maintain a metallic state or a semiconducting state during cell operation to provide oxygen movement that results in a low resistance to the resistive memory cell.

At 1120, a signal is applied across the two electrodes to place the resistive memory cell in a high resistive state or a low resistive state with no electric field across the barrier. An electric field can be applied during program or erase operations such that the electric field is higher than an electric field during a retention state. Operating a memory cell can include operating a memory cell structured similar to or identical to memory cells described herein.

The mechanism for cell operation can include oxygen movement from the oxide through the barrier to the dielectric to provide the HRS state and oxygen movement from the dielectric through the barrier to the oxide to provide the LRS state. Examples of a barrier region to provide enhance operation include, but are not limited to, a thin region of Ru, $RuO_2$, $In_2O_3$, or ZnO. For example, for a cell with PCMO as the oxide and $ZrO_x$ as the dielectric with a Ru region separating the PCMO and the $ZrO_x$ improved cell data retention was measured compared with a similarly structure cell with PCMO as a CMO and $ZrO_x$ as an IMO without a barrier region in a MVO cell. The comparison showed that the use of the Ru interlayer also increased the reading current of the LRS state by appropriately 3 orders at −1V to approximately $1e^4$ $A/cm^2$ from approximately $1e^0$ $A/cm^2$ of the cell without the Ru barrier. Such a resistive memory cell with a barrier region may provide fast sensing for a non-volatile memory cell.

Figure 12:
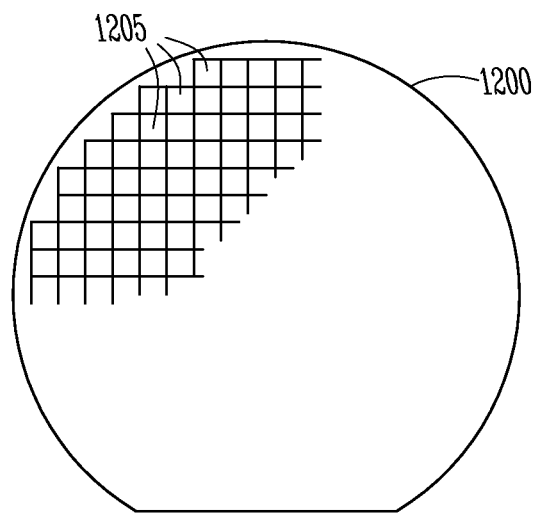
FIG. 12 shows a finished wafer, in accordance with various embodiments.

FIG. 12 illustrates an example of a wafer 1200 arranged to provide multiple electronic components. Wafer 1200 can be provided as a wafer in which a plurality of dice 1205 can be fabricated. Alternatively, wafer 1200 can be provided as a wafer in which the plurality of dice 1205 have been processed to provide electronic functionality and are awaiting singulation from wafer 1200 for packaging. Wafer 1200 can be provided as a semiconductor wafer, a semiconductor on insulator wafer, or other appropriate wafer for processing electronic devices such as an integrated circuit chips. Wafer 1200 can be fabricated in accordance with any embodiment related to FIGS. 1-11.

Using various masking and processing techniques, each die 1205 can be processed to include functional circuitry such that each die 1205 is fabricated as an integrated circuit with the same functionality and packaged structure as the other dice on wafer 1200. Alternatively, using various masking and processing techniques, various sets of dice 1205 can be processed to include functional circuitry such that not all of the dice 1205 are fabricated as an integrated circuit with the same functionality and packaged structure as the other dice on wafer 1200. A packaged die having circuits integrated thereon providing electronic capabilities is herein referred to as an integrated circuit (IC).

Wafer 1200 can include resistive memories, where each resistive memory is located in a die 1205. The resistive memory may be structured as a resistive random access memory. Each resistive memory can include resistive memory cells. Each resistive memory cell can include two electrodes with a dielectric between the two electrodes. The dielectric can be structured as an operably variable resistance of the resistive memory cell. One or more buffers may be arranged optionally in the resistive memory cell. The operably variable resistive dielectric can be structured as a dielectric separated from a source oxide by a barrier having a structure and a material composition having good oxygen diffusivity during program/erase, while having low oxygen diffusivity during retention. The program/erase can correspond to a high electric field, while a low electric field corresponds to retention. The barrier can be a metallic barrier. The structure and material composition of the barrier can be selected to maintain a metallic state or a semiconducting state during cell operation to provide oxygen movement to allow a low resistance to the resistive memory cell. Such a device architecture, with a barrier separating a dielectric from an oxide in a resistive memory cell, can improve performance of the memory device in which the resistive memory cell is disposed, compared with some conventional resistive memory devices.

Figure 13:
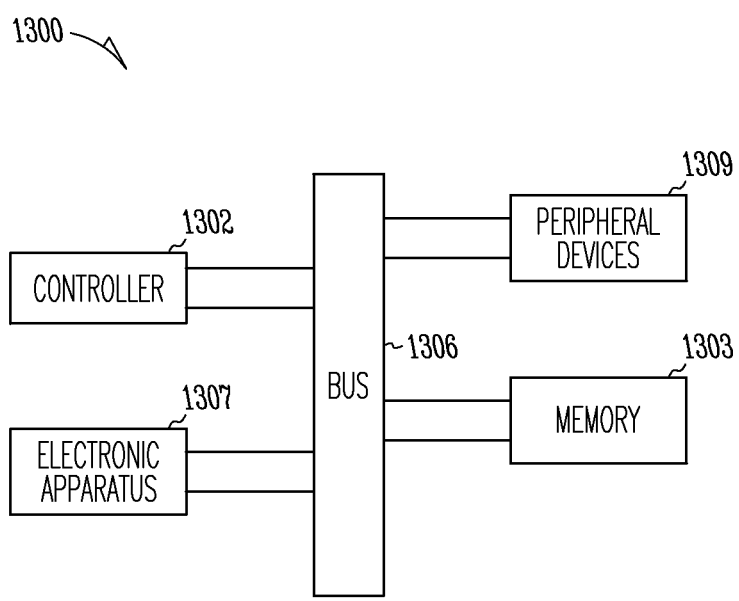
FIG. 13 shows a block diagram of various features of an electronic system, in accordance with various embodiments.

FIG. 13 shows a block diagram of a system 1300 that includes a memory 1303 structured as a resistive memory. The resistive memory can be a resistive random access memory. Each resistive memory cell of the resistive memory can include two electrodes with a dielectric between the two electrodes. The dielectric can be a dielectric structured as an operably variable resistance dielectric and disposed with a barrier and oxide separating it from at least one of the two electrodes. The device architectures of the resistive memory cell and the memory can be realized in a manner similar to or identical to structures in accordance with various embodiments discussed herein.

System 1300 can include a controller 1302 operatively coupled to memory 1303. System 1300 can also include an electronic apparatus 1307 and peripheral devices 1309. One or more of controller 1302, memory 1303, electronic apparatus 1307, and peripheral devices 1309 can be in the form of one or more ICs. A bus 1306 provides electrical conductivity between and/or among various components of system 1300. In an embodiment, bus 1306 includes an address bus, a data bus, and a control bus, each independently configured. In an alternative embodiment, bus 1306 uses common conductive lines for providing one or more of address, data, or control, the use of which is regulated by controller 1302. Controller 1302 can be in the form or one or more processors.

Electronic apparatus 1307 may include additional memory. Memory in system 1300 may be constructed as one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, and magnetic based memory.

Peripheral devices 1309 may include displays, imaging devices, printing devices, wireless devices, additional storage memory, and control devices that may operate in conjunction with controller 1302. In various embodiments, system 1300 includes, but is not limited to, fiber optic systems or devices, electro-optic systems or devices, optical systems or devices, imaging systems or devices, and information handling systems or devices such as wireless systems or devices, telecommunication systems or devices, and computers.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Thus, the following claims are hereby incorporated into the Detailed Description, with each claim standing on its own as a separate embodiment.

What is claimed is:

1. A method comprising:
    forming a resistive memory cell including:
        forming a first electrode;
        forming a dielectric structured as an operably variable resistance region on the first electrode;
        forming a plurality of structural pairs disposed on the dielectric, each structural pair having an oxide disposed on a metallic barrier such that the oxide and the metallic barrier are in direct contact with each other, each metallic barrier having metallic conductivity properties, the structural pairs stacked on each other on the dielectric, each metallic barrier formed with a structure and a material composition providing oxygen diffusivity above a first threshold of oxygen diffusivity during program or erase operations of the resistive memory cell and oxygen diffusivity below a second threshold of oxygen diffusivity during a retention state of the resistive memory cell, the first threshold greater than the second threshold, the structure and material composition selected to maintain a metallic state or a semiconducting state during cell operation to provide oxygen movement to allow a low resistance to the resistive memory cell; and
    forming a second electrode such that the plurality of structural pairs is disposed between the dielectric and the second electrode.

2. The method of claim 1, wherein forming one or more of the metallic barriers includes forming one or more of Ru, $RuO_2$, $In_2O_3$, or ZnO.

3. The method of claim 1, wherein forming the first electrode includes forming the first electrode in a silicon nitride region.

4. The method of claim 1, wherein forming the first electrode, forming the second electrode, forming the metallic barriers, or forming the dielectric includes using a monolayer or partial monolayer sequencing process.

5. The method of claim 1, wherein forming the first electrode, forming the second electrode, forming the metallic barriers, or forming the dielectric includes using a chemical vapor deposition. process.

6. The method of claim 1, wherein the method includes forming the plurality of structural pairs as a stack of contiguous structural pairs with a bottom of the stack having one element of a structural pair of the stack in contact with the dielectric such that the one element and the dielectric are in direct contact with each other.

7. A method comprising:
    forming a resistive memory cell including:
        forming a first electrode;
        forming a dielectric disposed on the first electrode, the dielectric formed of a material and structured as an operably variable resistance region;
        forming a plurality of structural pairs disposed on the dielectric, each structural pair having an oxide disposed on a metallic barrier such that the oxide and the metallic barrier are in direct contact with each other, each metallic barrier having metallic conductivity properties, the structural pairs stacked on each other, each metallic barrier formed having a structure and a material composition providing oxygen diffusivity above a first threshold of oxygen diffusivity during program or erase operations of the resistive memory cell and oxygen diffusivity below a second threshold of oxygen diffusivity during a retention state of the resistive memory cell, the first threshold greater than the second threshold; and
    forming a second electrode adjacent and contacting an oxide of the plurality of structural pairs such that the plurality of structural pairs is disposed between the dielectric and the second electrode with the structural pairs stacked on each other between the dielectric and the second electrode.

8. The method of claim 7, wherein forming the oxide contacting the second electrode includes forming oxide of one or more of praseodymium calcium manganese oxide, lanthanum strontium cobalt oxide, or lanthanum strontium manganese oxide.

9. The method of claim 7, wherein forming each of the metallic barriers includes selecting the structure and material composition of the respective metallic barrier to maintain a metallic state or a semiconducting state during cell operation to provide oxygen movement to allow a low resistance to the resistive memory cell.

10. The method of claim 7, wherein forming the metallic barriers includes forming one or more of Ru, $RuO_2$, $In_2O_3$, or ZnO.

11. The method of claim of 7, wherein forming the dielectric includes forming one or more of hafnium oxide, zirconium oxide, zirconium silicon oxide, zirconium silicon oxynitride, hafnium silicon oxide, hafnium silicon oxynitride, aluminum oxide, aluminum silicon oxide, aluminum silicon oxynitride, or combinations of these materials and forming the oxide includes forming one or more of praseodymium calcium manganese oxide, lanthanum strontium cobalt oxide, or lanthanum strontium manganese oxide.

12. The method of aim of 7, wherein forming one or both of the first electrode and he second electrode includes forming one or more noble metals.

13. A method comprising:
operating a resistive memory cell, the resistive memory cell including:
two electrodes:
a dielectric structured as an operably variable resistance region between the two electrodes, the dielectric disposed on one of the two electrodes; and
a plurality of structural pairs disposed between the dielectric and the other one of the two electrodes, each metallic barrier having metallic conductivity properties, each structural pair having an oxide disposed on a metallic barrier such that the oxide and the metallic barrier are in direct contact with each other, the structural pairs stacked on each other between the dielectric and the other one of the two electrodes, each metallic barrier having a structure and a material composition providing oxygen diffusivity above a first threshold of oxygen diffusivity during program or erase operations of the resistive memory cell and oxygen diffusivity below a second threshold of oxygen diffusivity during a retention state of the resistive memory cell, the first threshold greater than the second threshold, program and erase operations including an electric field applied between the two electrodes that is high with respect to an electric field applied between the two electrodes during a retention state; and
applying a signal across the two electrodes to place: the resistive memory cell in a high resistive state or a low resistive state with no electric field across the metallic barriers.

14. The method of claim 13, wherein the method includes providing an electric field during the program or erase operations such that the electric field is higher than an electric field during a retention state.

15. The method claim 13, wherein operating the resistive memory cell includes maintaining metallic or semiconducting status of the metallic barriers during operation of the resistive memory cell.

* * * * *